United States Patent [19]
Kim

[11] Patent Number: 6,161,300
[45] Date of Patent: Dec. 19, 2000

[54] ALCOHOL VAPOR DRYER SYSTEM

[76] Inventor: Jae Hyoung Kim, 105, Insan-youn-lip, 664 Naebalsan-dong, Ganseo-ku, Seoul, 157-280, Rep. of Korea

[21] Appl. No.: 09/341,134
[22] PCT Filed: Jan. 23, 1998
[86] PCT No.: PCT/KR98/00012
  § 371 Date: Jul. 14, 1999
  § 102(e) Date: Jul. 14, 1999
[87] PCT Pub. No.: WO98/33207
  PCT Pub. Date: Jul. 30, 1998

[30]    Foreign Application Priority Data

Jan. 23, 1997  [KR]   Rep. of Korea ....................... 97-875 U

[51] Int. Cl.⁷ .................................................. F26B 21/06
[52] U.S. Cl. ......................... 34/73; 34/74; 34/76; 34/78; 34/84; 34/85; 134/105; 134/902
[58] Field of Search .................................. 34/72, 73, 74, 34/76, 78, 84, 85; 134/105, 902

[56]    References Cited

U.S. PATENT DOCUMENTS

| | | | |
|---|---|---|---|
| 4,841,645 | 6/1989 | Bettcher et al. | 34/78 |
| 4,977,688 | 12/1990 | Robertson, Jr. et al. | 34/92 |
| 5,115,576 | 5/1992 | Robertson, Jr. et al. | 34/92 |
| 5,371,950 | 12/1994 | Schumacher | 34/78 |
| 5,539,995 | 7/1996 | Bran | 34/77 |
| 5,940,985 | 8/1999 | Kamikawa et al. | 34/471 |

*Primary Examiner*—Pamela Wilson
*Attorney, Agent, or Firm*—Jacobson, Price, Holman & Stern, PLLC

[57]    ABSTRACT

An alcohol vapor dryer system includes a vapor generating chamber, a heater, a process chamber, a gas supplier, a drain vessel, and a suction device. The vapor generating chamber of cylindrical shape contains liquid alcohol supplied from an outer source and includes a fan installed above the surface of the liquid alcohol. The heater installed below the vapor generating chamber heats the liquid alcohol contained in the vapor generating chamber at a temperature lower than the boiling point of the liquid alcohol. The process chamber communicates with the vapor generating chamber through a plurality of fluid ducts and includes a body and a cover plate for covering the body. The gas supplier generates heated nitrogen gas and supplies the gas in order to transfer the heated nitrogen gas and the alcohol vapors to the fluid ducts which are connected to the process chamber. The drain vessel communicates with the bottom of the body of the process chamber and also with the bottom of the vapor generating chamber. The suction device has two ends, wherein one end of the two ends is connected to the drain vessel for quickly drying the alcohol vapors remaining in the process chamber and the condensed liquid alcohol on the workpieces and the jig.

6 Claims, 4 Drawing Sheets

ALCOHOL VAPOR DRYER SYSTEM

FIELD OF THE INVENTION

This invention relates to a dryer system for drying workpieces during the process of manufacturing semiconductor wafers or LCDs, and more particularly to an isopropyl alcohol (IPA) dryer system which dries the microdroplets remaining in the workpiece by exposing the workpiece to the isopropyl alcohol vapor.

BACKGROUND ART

In the process of manufacturing semiconductor wafers or LCDs ("workpieces" hereinafter), the workpieces are normally subject to many wet cleaning steps using chemicals. The chemicals are rinsed away using deionized water after the cleansing step. If the workpiece is allowed to dry naturally, the water can leave some stains or spots on the surface of the workpiece, which may result in a defective product. Thus, various dryer systems have been developed to dry the surface of the workpiece throughly, so as not to leave any residue thereon.

For drying workpieces after the rinsing step, a rotary drying apparatus utilizing centrifugal force were used. However, this type of dryer does not show satisfactory drying performance, and the rate of defective product gets higher as the capacity of a semiconductor memory and the size of a LCD substrate increase.

Thus, new dryer systems using alcohol vapor (typically called as alcohol vapor dryer systems) have been developed and used widely in order to solve the above mentioned problems. In the vapor dryer system, alcohol (e.g IPA) condenses and combines with the remaining water droplets on the surface of the workpiece. By this combination, the water droplet loses its surface tension and is released from the surface of the workpiece to be discharged.

Many conventional dryer systems employ only one chamber, and both alcohol vaporization and drying process are carried out within the chamber. For example, liquid IPA is supplied to the bottom of the chamber and heated to a temperature around 240° C., which is three times higher than the boiling point of liquid IPA. Then the workpiece to be dried is exposed to the IPA vapor cloud generated by the heating process in the same chamber. This type of vapor dryer systems are disclosed by Bettcher in U.S. Pat. No. 4,841,645, and many other publications.

However, those conventional vapor dryer systems retain several drawbacks. Since the operation of carrying in/out of the workpiece to/from a dryer system is performed in the very chamber where the liquid IPA is heated and vaporized, the chamber cannot be sealed. Thus, combined with the fact that the liquid IPA is heated at a very high temperature to produce and transfer the IPA vapor, there are substantial chances of fire due to IPA leakage. Further, the rate of producing defective product may increase since the workpiece is in contact with the various contaminants in the air, which was introduced into the chamber whenever workpiece is carried into/out of the chamber.

In addition, because there is no separate control means for controlling the volume of the supplied IPA vapor in the conventional vapor dryer systems, the operating conditions for the drying process should be maintained as initially set. Therefore it is impossible to adjust the volume of the IPA vapor according to the size of the workpiece to be dried. Thus, the workpiece cannot be dried throughly when the workpiece is relatively large, and excess IPA vapors are supplied when the workpiece is relatively small, which will lead to an increased defective rate or increased cost, respectively.

A dryer system which partly addresses the above described problems is disclosed by Robert S. in U.S. Pat. No. 5,226,242 which was assigned to Santa Clara Plastics. In the system disclosed by Robert, an area for generating the IPA vapor and an area for drying the workpiece are separated. In this system, two vessels are disposed one inside the other such that a vapor generating region is formed in the space between the two vessels. Vapor generation takes place in the space between the bottom walls of the two vessels, and a base heater plate along the bottom wall of the outer vessel provides the heat required to vaporize the liquid IPA. Heated nitrogen gas is also provided to the vapor generation area to assist in the efficient generation of vapors. Thus generated vapor and the nitrogen then flow into the space between the two vessels above the region in which the vapor is generated, and then flow into the inner vessel for drying the workpiece deposited therein.

However, in the alcohol vapor dryer system disclosed by Robert, it is impossible to generate the IPA vapor in advance in the vapor generated area before the actual drying process begins. This is due to the fact that, if the IPA vapor is generated in advance, it will flow into the inner vessel through the injection channels between the two vessels before the drying process starts. Thus, the IPA vapor is generated and is supplied to the inner vessel (which corresponds to a process chamber) right after the process actually begins. With this configuration, it will take a considerable amount of time for the IPA vapor to reach the surface of the workpiece which has been already introduced in the inner vessel. This may allow some water droplets on the surface of the workpiece to be dried naturally in the mean time, by the heat of the inner vessel itself (though the actual size of the droplet varies, typically it is small enough to be dried easily by a small quantity of heat). As mentioned above, the natural dry of the workpiece is likely to leave water residue spots on the surface of the workpiece, which will eventually increase the defective rate of the final products. Further, the system is not completely free from the risk of fire.

Accordingly, it is an object of the present invention to solve the above mentioned drawbacks of the conventional dryer system and to provide a vapor dryer system which enables to completely separate the chamber where the workpiece are dried from the vapor generating region.

Another object of the present invention is to provide an alcohol vapor dryer system which is completely free from the chances of fire.

Further another object of the present invention is to provide an alcohol vapor dryer system which allows the operator to adjust the conditions for drying process easily, according to the size of the workpiece and the shape of the jig that holds the workpiece during the entire drying process.

It is also an object of the present invention to provide an alcohol vapor dryer system which can prevent any part of the workpiece from being dried naturally.

It is still a further object of the present invention to provide an IPA vapor dryer that performs its drying process with optimal condition, by modifying the configuration of the spraying pipes which spray the IPA vapor and the heated nitrogen gas toward the workpiece, and by adjusting the spraying angle of the through holes (i.e. jets) formed on the spraying pipes, according to the size of the workpiece and the shape of the jig holding the workpiece during the drying process.

DISCLOSURE OF THE INVENTION

The present invention achieves the above described objects as well as other objects by providing a vapor dryer system comprising:

- a vapor generating chamber of cylindrical shape containing liquid alcohol supplied from an outer source and including a fan installed above the surface of the liquid alcohol;
- a heating means installed below the vapor generating chamber for heating the liquid alcohol contained in the vapor generating chamber at a temperature lower than the boiling point of the liquid alcohol;
- a process chamber communicated with the vapor generating chamber through a plurality of fluid ducts, and comprising a body and a cover plate for covering the body, said body is provided with a jig for holding workpieces to be dried and multiple spraying pipes on which a plurality of through holes are formed;
- a gas supplying means for generating heated nitrogen gas and for supplying the gas in order to transfer the heated nitrogen gas and/or the alcohol vapors to the fluid ducts which are connected to the process chamber;
- a drain vessel which communicates with the bottom of the body of the process chamber and also with the bottom of the vapor generating chamber, for receiving mixture of the alcohol vapors drained from the process chamber and from the vapor generating chamber and for cooling the mixture to a predetermined temperature before the mixture being discharged; and
- a suction means with its one end being connected to the drain vessel for quickly drying the alcohol vapors remaining in the process chamber and the condensed liquid alcohol on the workpieces and the jig.

Preferably, the vapor generating means and the fluid ducts can be surrounded by lagging materials in order to prevent the vapor generated at the vapor generating chamber from being condensed while the vapor moves in the dryer system.

Hereinafter, the detailed embodiments of the present invention will be described with reference to the attached drawings.

Figure 1:
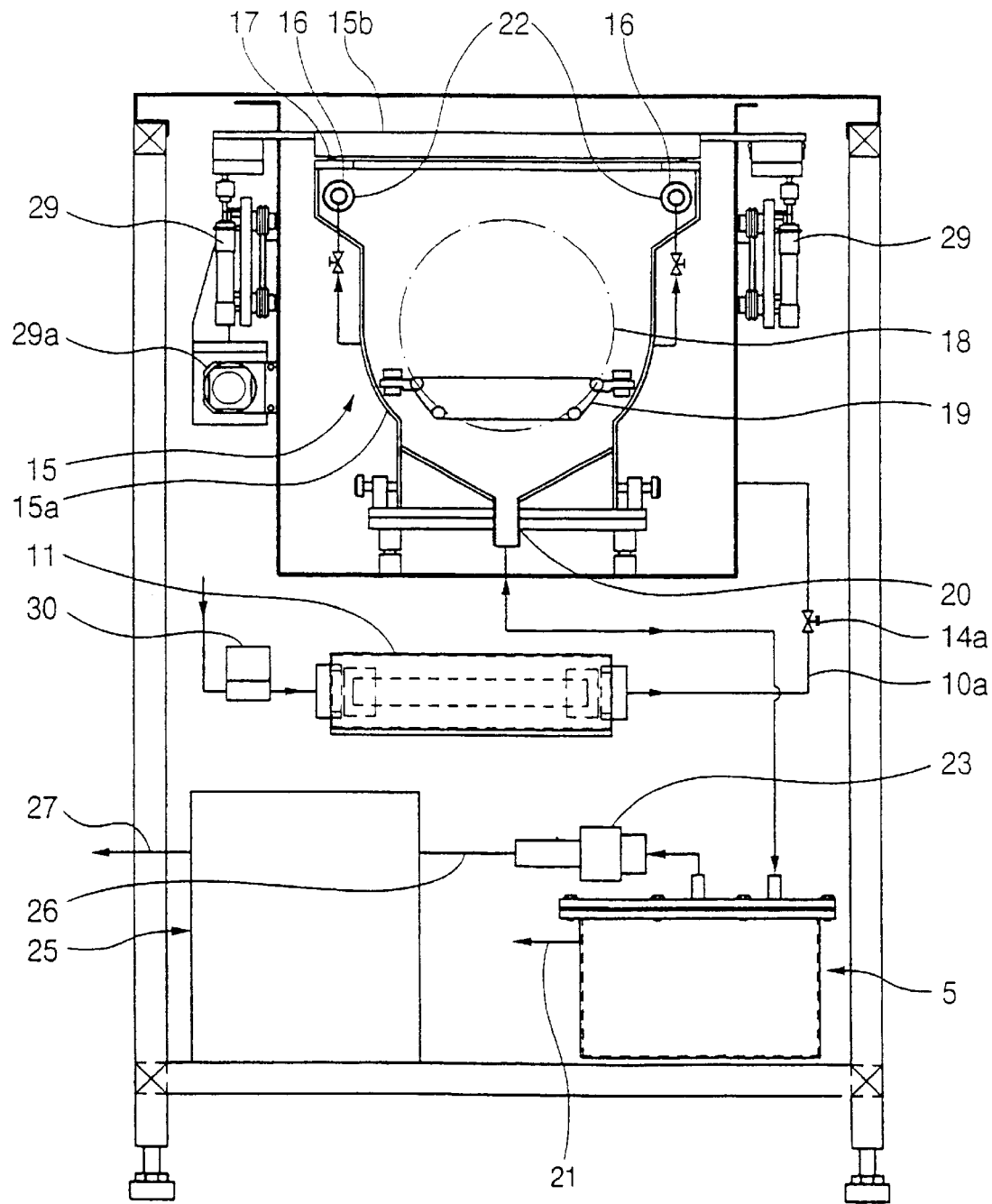
FIG. 1 is a front view of the alcohol vapor dryer system in accordance with the present invention.
Figure 2:
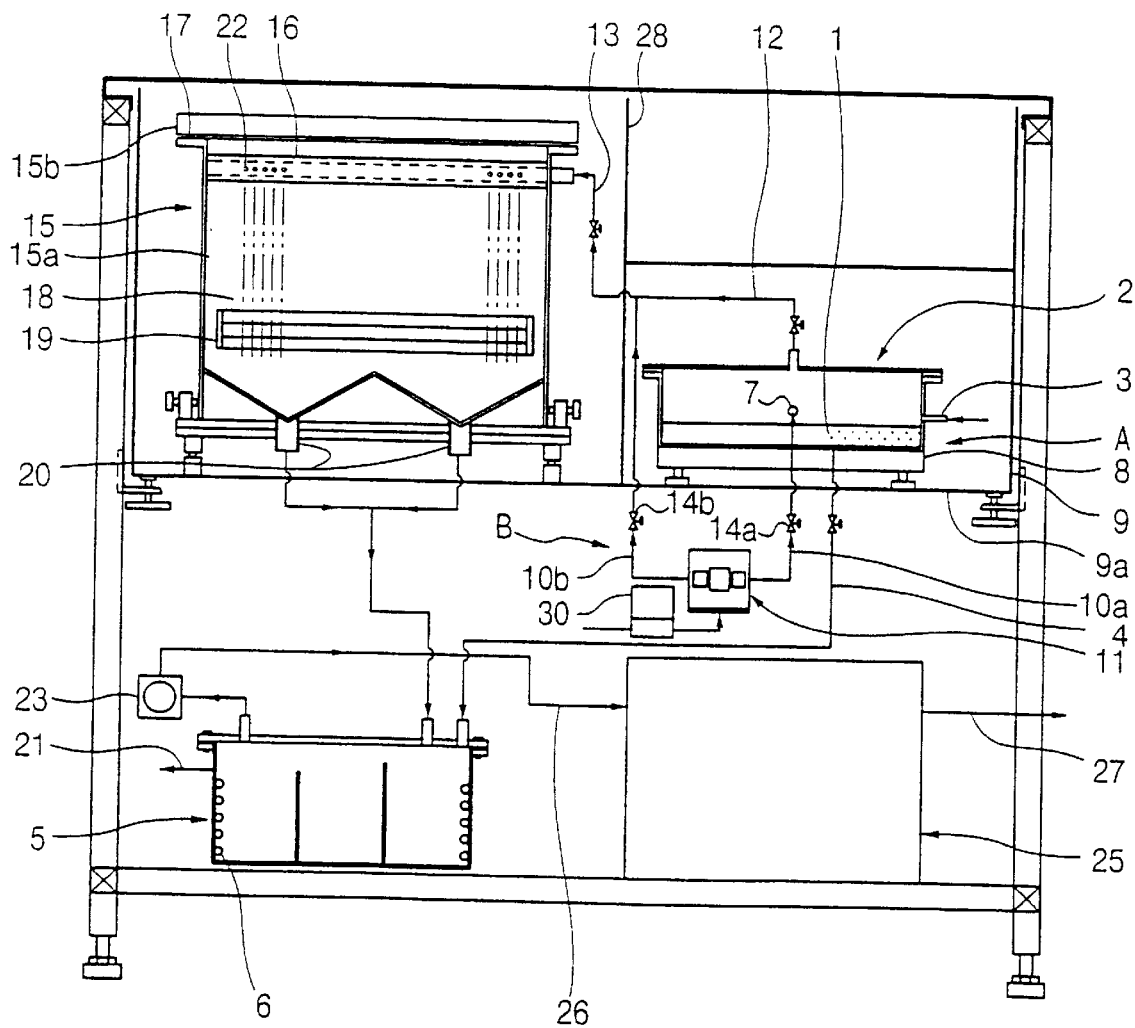
FIG. 2 is a right side view of the alcohol vapor dryer system shown in FIG. 1.
Figure 3:
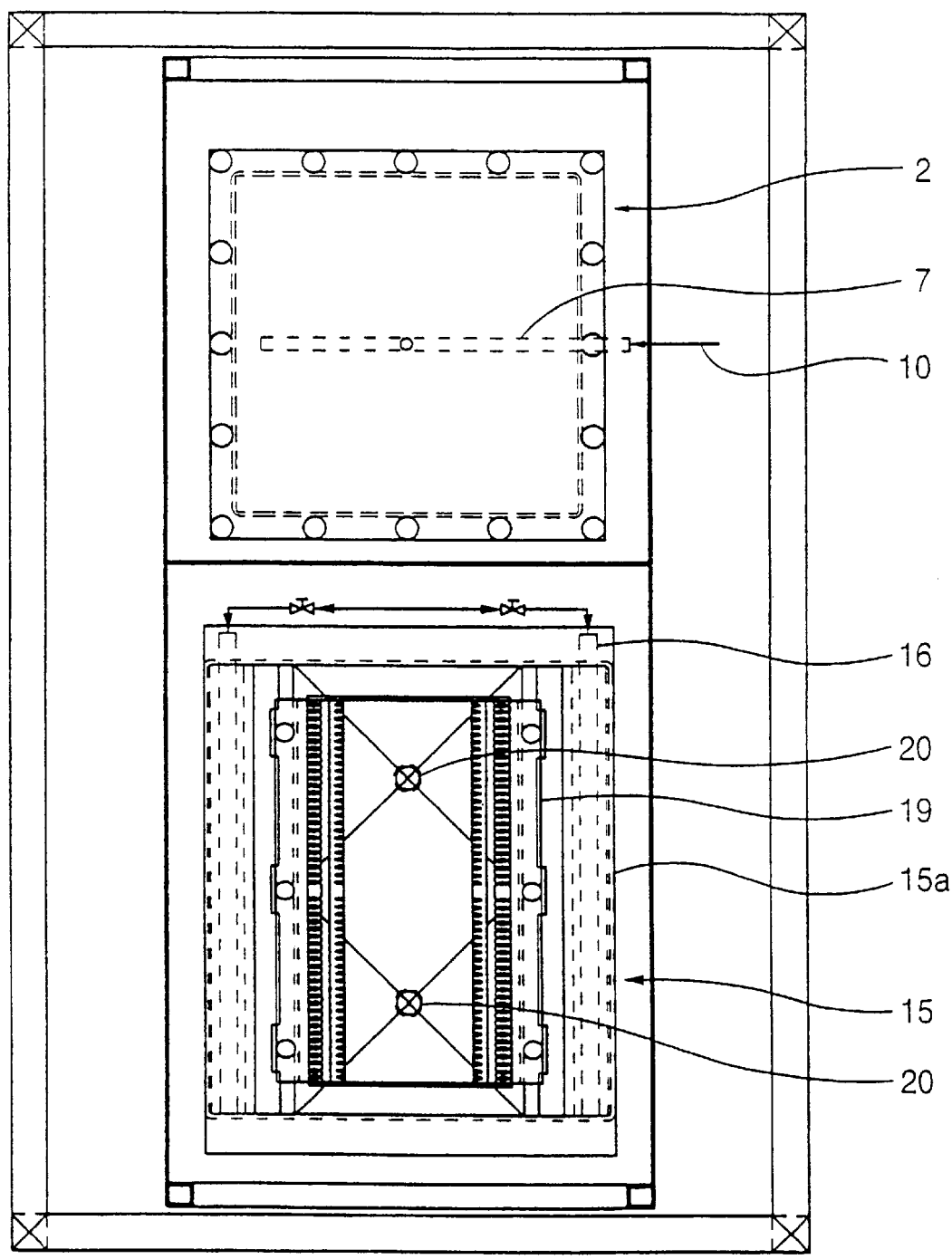
FIG. 3 is a top plan view of the alcohol vapor dryer system shown in FIG. 1.

FIG. 1 is a front cross-sectional view of a preferred embodiment of the vapor dryer system in accordance with the present invention, while FIG. 2 and FIG. 3 respectively illustrate a right side view and a plan view of the system depicted in FIG. 1.

Now referring to FIG. 2, the vapor dryer system in a preferred embodiment comprises a vapor generating chamber (2) which generates the IPA vapor by heating the liquid IPA therein. Preferably, the vapor generating chamber (2) has cylindrical shape and is made of quartz glass. The chamber may also be made of stainless steel coated with fluorine-containing resin. A pipe (3) for supplying the liquid IPA (1) from the exterior reservoir (not shown) is connected to the vapor generating chamber at the one side of the rear wall of the vapor generating chamber (2), and a drain pipe (4) for discharging the liquid alcohol (1) is connected to the bottom part of the vapor generating chamber (2) and to a drain vessel (5). The drain pipe (4) can be used to drain the liquid alcohol into the drain vessel (5) when it is needed.

Cooling water pipes (6) are installed on the inner walls of the drain vessel (5) in order to lower the temperature of the mixture of IPA and water. The mixture is formed from the contact of the liquid IPA with the water droplets on the surface of the workpiece (18) and then collected in the vessel (5). After the temperature is lowered to the room temperature, the mixture is discharged to the outside of the system.

In the vapor generating chamber (2), a circular fan (7) having a plurality of holes is installed above the surface of the liquid alcohol (1). Preferably, lagging materials surround the top side, the bottom side and the lateral sides of the vapor generating chamber. A heater (not shown) for maintaining the constant temperature of the vapor generating chamber (2) may be installed at the outside of the chamber.

Beneath the outer bottom of the vapor generating chamber (2), a heater (8) is provided for heating the liquid alcohol (1) contained in the vapor generating chamber (2) to a temperature not higher than the boiling point of the liquid alcohol. Both the heater (8) and the vapor generating chamber (2) are disposed on the bottom plate (9a) of a casing (9) made of stainless steel.

The fan (7) in the vapor generating chamber (2) is connected through a gas duct (10a) to a gas generator (11) which is installed separately from the casing (9). As soon as the heated nitrogen gas is supplied from the gas generator (11) to the fan (7) through the gas duct (10a), the alcohol vapors generated in the vapor generating chamber will be transported to a process chamber (15) via a fluid duct (12). The process chamber (15) will be explained in detail below.

Another gas duct (10b) from the gas generator (11) communicates with the upper part of the process chamber (15) via a fluid duct (13). Preferably, each gas duct (10a) (10b) is equipped with an air valve (14a) (14b), respectively, in order to selectively supply the heated nitrogen gas from the gas generator (11), to the fluid duct (13) directly or to the fan (7) by the opening/closing operation of the air valves (14a,14b). The amount of gas supplied to each duct is adjusted by a gas flow adjuster(30).

The process chamber (15) functions to remove the remained droplets as well as other contaminants from the workpiece (18) and to dry the workpiece thoroughly, by exposing the droplets and various other contaminants to the alcohol vapors. Though the process chamber (15) is made of quartz glass in the preferred embodiment of the present invention, it may also be made of other materials such as stainless steel. Preferably, the process chamber (15) is installed in a higher location than that of the vapor generating chamber (2) and is completely separated from the vapor generating chamber (2) by the central wall plate (28) made of stainless steel. The process chamber (15) is of cylindrical shape and comprises a body (15a) and a cover plate (15b). Multiple spraying pipes (16), each having a plurality of through holes (22), are provided on the upper zone of the body (15a).

The multiple spraying pipes (16) may be made of quartz glass and may be installed on several places in the body (15a), considering the size of the workpiece and the shape of the jig. A plurality of through holes (22) on each of the multiple spraying pipes (16) can be formed in a direction to maximize the drying performance. The configurations of the multiple spraying pipes and the direction of the through holes on each pipe are shown for example in FIG. 4a, FIG. 4b and FIG. 4c.

The jig (19) is made of quartz glass in the preferred embodiment of the present invention, but also can be made of PEEK material which is a kind of fluorine-containing resin for preventing the edges of the workpiece from being broken. The bottom of the body (15a) communicates with the barrel (5), using the drain pipe (20) through which the resulting mixture is discharged. The mixtures, formed by the contact of the alcohol vapor with the droplets on the workpiece are collected in the drain vessel (5) and the temperature of the collected mixture is lowered by the cooling water pipes (6) installed at two opposite side walls of the drain vessel (5), and then the cooled mixture will be discharged to the outside of the system via the drain pipe (21) below the drain vessel (5).

A suction means (23), with its one end connected to the upper part of the drain vessel (5) and its other end to a vapor scavenging means (25), operates to suck out the remaining alcohol vapors from the process chamber (15) rapidly. The uncondensed remaining alcohol vapor will be finally collected by the vapor scavenging means (25) while the suction means (23) operates.

The cover plate (15b) of the process chamber (15) is opened/closed by an air cylinder (29,29a), and an "O"-ring is preferably placed between the cover plate (15b) and the body (15a) in order to seal the process chamber completely when the cover plate closes the body of the process chamber, and thereby to prevent the alcohol vapors and the heated nitrogen gas from leaking out of the process chamber (15).

The operation of the dryer system according to the present invention will be explained hereinafter.

First, the cover plate (15a) of the process chamber (15) is lifted by the air cylinder (29a,29b) and then moved backward to open the process chamber. With this state, the workpiece (18) is introduced into the process chamber (15), then deposited on the jig (19). Then the cover plate (15a) closes the process chamber to start the during process.

The liquid alcohol (1) is supplied into the bottom of the vapor generating chamber (2) and then is heated to a temperature lower than the boiling point of the liquid alcohol by the heater located below the vapor generating chamber (2). Thus, there is no danger of fire even in the case of leaking out the alcohol vapor or the liquid alcohol, since a low-temperature heater (8) can be employed in the embodiment of the present invention. Further, since the liquid alcohol is heated to a temperature lower than the boiling point of the alcohol, it is also possible to prevent some contaminants contained in the liquid alcohol from being vaporized.

The alcohol vapors thus produced cannot move by themselves to the process chamber (2) via the fluid duct (12). Considering spontaneous movement into the process chamber, the amount is not enough to dry the workpiece (18) completely. Therefore, the nitrogen gas is supplied from the heated nitrogen gas generator (11) toward the fan (7) located above the surface of the liquid alcohol (1) in the vapor generating chamber (2) to transfer the alcohol vapors to the process chamber(15). By the nitrogen gas, additional alcohol vapors are generated in the vapor generating chamber (2).

The additionally generated vapors as well as the alcohol vapors already generated are all transferred to the fluid ducts (12,13) and then to the multiple spraying pipes (16) located at the upper zone of the process chamber (15) by the nitrogen gas. Next, the alcohol vapors are sprayed into the body (15a) of the process chamber (15) through a plurality of through holes (22) formed on the spraying pipes (16).

The water droplets on the workpiece (18) which are deposited on the jig (19) in wet state after the workpiece treated with chemicals and cleaned with pure water, contact with the alcohol vapors ejected from the spraying pipes (16). The resulting mixture should be discharged immediately from the process chamber (15), since it contains some kinds of dirts and contaminants therein. The discharge mixtures are collected in the drain vessel (5) through the drain pipe connected to the bottom of the process chamber (15). The collected mixtures, which have relatively high temperature of around 80° C., are cooled to the room temperature by the cooling water in the cooling water pipes (6) disposed on the side walls of the drain vessel (5), and then discharged from the dryer system through the pipe (21) connected to the one side of the drain vessel (5).

Some alcohol vapors may still remain in the process chamber (15), after the droplets are removed from the entire surface of the workpiece and then drained to the drain vessel (5). To dry the workpiece perfectly, all the alcohol vapors should be evacuated from the process chamber. For the purpose, the air valve (14a) installed on the gas duct (10a) is closed to block the heated nitrogen gas supplied toward the fan (7). Instead, the nitrogen gas is supplied to the gas duct (10b) which is directly connected to the fluid duct (13) and then is sprayed in to the body (15a) of the process chamber (15) through a plurality of through holes (22) formed on the multiple spraying pipes (16).

By the pure nitrogen gas sprayed into the process chamber (15), the alcohol vapors remaining in the inner space of the process chamber (15) as well as the alcohol vapors on the workpiece (18) and the jig (19) are all evacuated and collected in the drain vessel (5) through the drain pipe (20). By the suction means (23) which is connected to the drain vessel (5), the speed of evacuating the remaining alcohol vapors from the process chamber (15) into the drain vessel (5) through the drain pipe (20) can be considerably increased.

Further, the suction means(23) accelerates drying of the liquid formed by the condensing of the alcohol vapors remaining on the workpiece (18) and the jig (19). In order to prevent the alcohol vapors from being discharged in their vapor state, i.e. without condensing into the liquid state, they are transferred from the suction means (23) to the alcohol vapor scavenging means (25) through a duct (26).

As mentioned above with regard to the cooling of the mixture which is formed by the contact of the alcohol vapor with the droplets on the workpiece, the condensed liquid of the alcohol vapors will be cooled down in the same manner, i.e. by the cooling water that flows in the cooling water pipes (6) disposed inside of the drain vessel (5), and then be drained to the outside of the system.

Completing all the above mentioned processes, the workpiece (18) in the process chamber will be in a clean and dried state.

The alcohol vapor spraying operation by the multiple spraying pipes (16) in the process chamber (15) will be explained hereinafter with referring to FIG. 4a, FIG. 4b and FIG. 4c. Each of these figures depicts a possible configuration of the vapor spraying pipes (16).

Figure 4A:
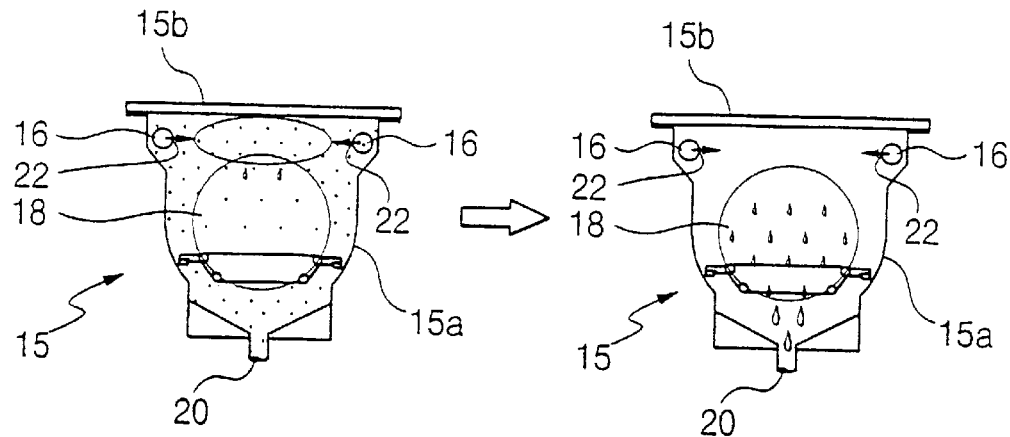
FIG. 4a illustrates schematically the IPA vapor spraying operation of the dryer system in accordance with the a embodiment of the present invention.

Referring to FIG. 4a, the multiple spraying pipes (16) are installed on two lateral sides in the upper zone of the process chamber and a plurality of through holes (22) are formed on each spraying pipe in horizontal direction to eject the alcohol vapors to the upper center of the process chamber through the holes. The workpiece is completely dried as the alcohol vapors ejected and clustered at the upper center of the process chamber move downward over the entire surface of the workpiece disposed on the jig (19). This configuration is particularly suitable for drying the workpiece in a standard dimension.

Figure 4B:
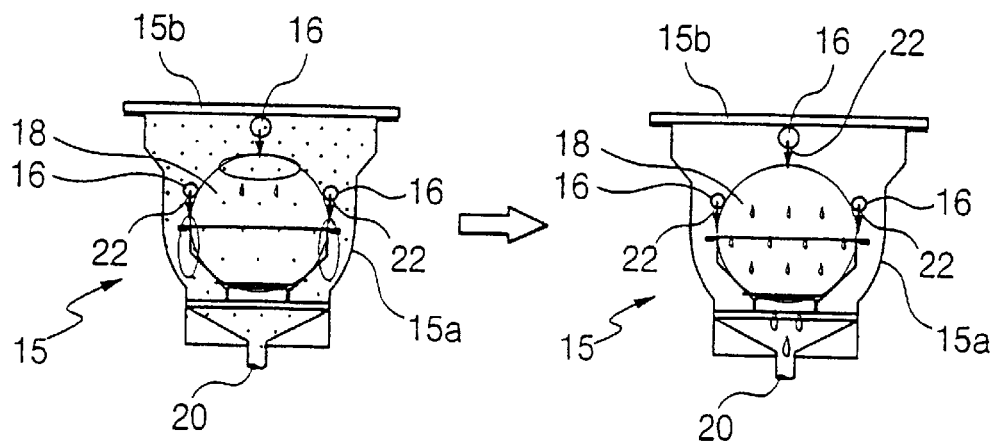
FIG. 4b illustrates schematically the alcohol vapor injecting operation of the dryer system in accordance with another embodiment of the present invention.

In FIG. 4b, a spraying pipe (16) of a predetermined cross sectional area is located at the center of the upper zone of the body (15a) and two spraying pipes of about a half the cross-sectional area of the above mentioned the pipe placed in center are disposed in two lateral areas, slightly below the pipe in center. The through holes on the central spraying pipe form at least two lines to widely distribute the alcohol vapors in the upper part of the body, while the through holes on the two lateral spraying pipes form one line for each pipe. All the through holes on each of the spraying pipes are formed in vertical direction. The workpiece can be dried completely as the alcohol vapors sprayed from the multiple spraying pipes move downward. This configuration is particularly suitable for drying workpiece of relatively larger than the standard dimension.

Figure 4C:
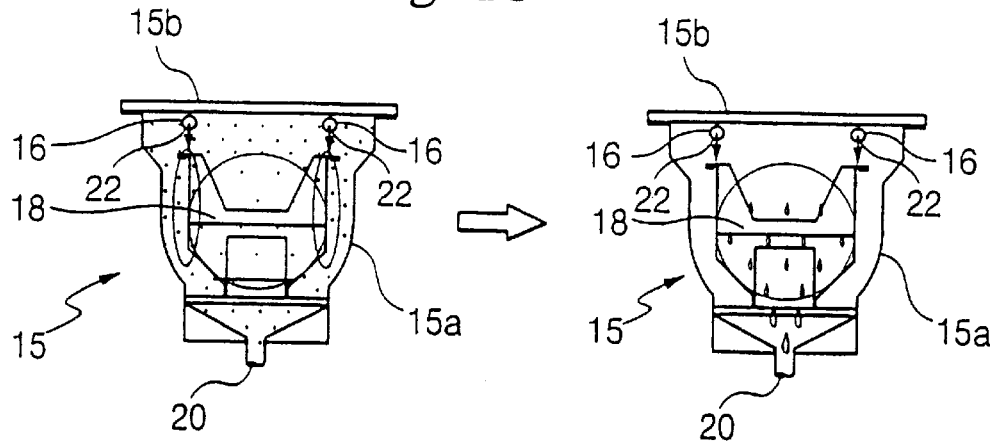
FIG. 4c illustrates schematically the alcohol vapor injecting operation of the dryer system in accordance with another embodiment of the present invention.

In FIG. 4c, two spraying pipes (16) are located on the two lateral sides in adjacent to the top area of the body (15a) and the through holes (22) on the pipes are formed in vertical direction. The workpiece can be completely dried as the alcohol vapors ejected from the spraying pipes (16) to the flange of the jig (19) and distributed in two lateral side areas of the workpiece (18) move downward. This configuration is also suitable for drying workpiece in a standard dimension.

Therefore, as shown in FIG. 4a, FIG. 4b and FIG. 4c, drying process can be more effectively performed by modifying the configuration of the multiple spraying pipes (16) and the direction of the through holes (22), according to the size of the workpiece (18) and the shape of the jig (19). Further, the drying process can be more optimized by controlling the volume of the alcohol vapors and the heated nitrogen gas to be supplied to the multiple spraying pipes (16). This can be accomplished by utilizing the gas flow adjuster (30) which adjusts the volume of heated nitrogen gas generated in the heated nitrogen gas generator (11), as mentioned above.

With the alcohol vapor dryer system according to the present invention, following advantages and other advantages can be obtained:

First, since the vapor generating chamber (2) has a completely sealed structure, the liquid alcohol therein cannot contact with the air. Thus, the purity of the liquid alcohol in the vapor generating chamber (2) remains unchanged so that any adverse effect that may degrade the quality of the processed workpiece can be avoided. In addition, it is possible to avoid any adverse effect caused by the workpiece's contact with the air.

Second, it is perfectly safe from hazard caused by fire, since the place where the heater locates is completely separated from the other places of the system by a plate made of stainless steel, and the heater of a type which heats the liquid alcohol to a temperature lower than the boiling point of the alcohol can be employed.

Third, by controlling the temperature of the heated nitrogen gas that have been generated in the heated nitrogen generator (11) and by controlling the amount of the supplied nitrogen gas, it is possible to automatically adjust the amount of the alcohol vapor generated as well as the heated nitrogen.

Fourth, the consumption of the liquid alcohol which is highly volatile can be greatly reduced since there is no natural consumption of the liquid alcohol or the vapor thereof.

According to the above mentioned features and other advantages, the entire cost of the process is greatly reduced by the high productivity achieved during the process of manufacturing semiconductors or LCDs.

What is claimed is:

1. Alcohol vapor dryer system comprising:

a vapor generating chamber of cylindrical shape containing liquid alcohol supplied from an outer source and including a fan installed above the surface of the liquid alcohol;

a heating means installed below the vapor generating chamber for heating the liquid alcohol contained in the vapor generating chamber at a temperature lower than the boiling point of the liquid alcohol;

a process chamber communicated with the vapor generating chamber through a plurality of fluid ducts, and comprising a body and a cover plate for covering the body, said body is provided with a jig for holding workpieces to be dried and multiple spraying pipes on which a plurality of through holes are formed;

a gas supplying means for generating heated nitrogen gas and for supplying the gas in order to transfer the heated nitrogen gas and the alcohol vapors to the fluid ducts which are connected to the process chamber;

a drain vessel which communicates with the bottom of the body of the process chamber and also with the bottom of the vapor generating chamber, for receiving a mixture of the alcohol vapors drained from the process chamber and from the vapor generating chamber and for cooling the mixture to a predetermined temperature before the mixture being discharged; and a suction means having two ends wherein one of the ends being connected to the drain vessel for quickly drying the alcohol vapors remaining in the process chamber and the condensed liquid alcohol on the workpieces and the jig.

2. The system of claim 1, wherein the vapor generating chamber and the fluid ducts are surrounded by lagging materials.

3. The system of claim 1, wherein the gas supplying means includes:

a nitrogen gas generator for producing the heated nitrogen gas;

a gas flow adjuster for adjusting the amount of the heated nitrogen to be supplied to the vapor generating chamber and thus for adjusting the amount of the generated alcohol vapor;

a plurality of gas ducts, each having one end connected to the gas generator with the other end connected to one of the fluid ducts or the fan; and a plurality of air valves installed on each of the corresponding gas ducts.

4. The system of claim 1, wherein the multiple spraying pipes are installed in the center area and in two lateral areas in the upper zone of the process chamber.

5. The system claimed in claim 1, wherein a plurality of the through holes on each of the multiple spraying pipes are formed in a horizontal direction.

6. The system claimed in claim 1, wherein a plurality of the through holes on each of the multiple spraying pipes are formed in a vertical direction.

\* \* \* \* \*